United States Patent [19]
McClure

[11] Patent Number: 5,349,246
[45] Date of Patent: Sep. 20, 1994

[54] INPUT BUFFER WITH HYSTERESIS CHARACTERISTICS

[75] Inventor: David C. McClure, Carrollton, Tex.

[73] Assignee: SGS-Thomson Microelectronics, Inc., Carrollton, Tex.

[21] Appl. No.: 995,666

[22] Filed: Dec. 21, 1992

[51] Int. Cl.$^5$ .............................................. H03K 17/16
[52] U.S. Cl. .................................... 307/443; 307/451; 307/359
[58] Field of Search ................. 307/443, 451, 290–291, 307/359

[56] References Cited

U.S. PATENT DOCUMENTS

| | | | |
|---|---|---|---|
| 4,490,633 | 12/1984 | Noufer et al. | 307/451 |
| 4,506,168 | 3/1985 | Uya | 307/359 |
| 4,539,489 | 9/1985 | Vaughn | 307/359 |
| 4,904,884 | 2/1990 | O'Shaughnessy | 307/359 |
| 5,177,376 | 1/1993 | Wellnitz | 307/359 |

OTHER PUBLICATIONS

Sedra, et al., Microelectronic Circuits (Holt, Rinehart & Winston, 1982), pp. 734–735.

*Primary Examiner*—Edward P. Westin
*Assistant Examiner*—Andrew Sanders
*Attorney, Agent, or Firm*—Rodney M. Anderson; Lisa K. Jorgenson; Richard K. Robinson

[57] ABSTRACT

An input buffer circuit is disclosed which has feedback hysteresis transistors having similar size characteristics as the drive transistors. The drive transistors are located in a first inverting CMOS stage, connected in conventional CMOS inverter fashion. The drains of the drive transistors are connected to the input of an inverter, the output of which drives the signal to elsewhere in the integrated circuit. A first hysteresis leg is provided, consisting of a plurality of p-channel transistors with their source/drain paths in series between the input of the inverter and a power supply voltage; the gate of at least one of the p-channel hysteresis transistors is coupled to the output of the inverter, and the gates of those of the hysteresis transistors that are not coupled to the inverter output are biased to ground. A second hysteresis leg of n-channel hysteresis transistors, similarly but complementarily configured, is provided between ground and the inverter input. The hysteresis transistors each have channel lengths substantially the same as the drive transistors, thus reducing the capacitive load at the output of the inverter and also ensuring good tracking over process variations; the channel widths of the hysteresis transistors may also be made sufficiently wide to avoid small width effects, and thus also provide improved tracking.

21 Claims, 2 Drawing Sheets

INPUT BUFFER WITH HYSTERESIS CHARACTERISTICS

This invention is in the field of integrated circuits, and is more particularly directed to input buffer circuits used therein.

BACKGROUND OF THE INVENTION

As is well known in the field, the parameter c.f noise immunity is important in ensuring the stable operation of modern integrated circuits. Since the magnitude of noise from parasitic inductance of a conductive line increases with the switching speed of signals carried thereon, the noise immunity of a circuit has become more problematic in recent years, considering that the switching frequencies of digital integrated circuits has increased to on the order of tens of MHz. The design of input buffers for modern integrated circuits, such input buffers for receiving signals from conductors external to the circuit, has thus become crucial in assuring acceptable noise immunity characteristics for the circuit at such frequencies.

A conventional approach to providing noise immunity for input buffers of integrated circuits is to provide hysteresis in the transfer characteristic of the buffer. As is fundamental in the art, hysteresis in the transfer characteristic means that the switching threshold voltage of a circuit depends upon the polarity of the excursion at the input, so that the threshold voltage for switching the buffer is offset from the threshold voltage for switching back to the prior state. For example, a conventional buffer may have a threshold voltage of 2.0 volts for switching from a "0" to a "1" state, but a threshold voltage of 0.8 volts for switching from a "1" to a "0" state; 1.2 volts of noise immunity is thus provided.

Referring to FIG. 1, conventional CMOS input buffer 1 with a hysteresis characteristic is illustrated. Pad 8 is the bond pad which receives the signal from external to the integrated circuit in which buffer 1 is implemented. A first stage of buffer 1 is a CMOS inverter formed by p-channel pull-up drive transistor $2p$ and n-channel pull-down drive transistor $2n$, which have their source-drain paths connected in series between the $V_{cc}$ power supply and ground, and which have their gates connected to pad 8. It is to be noted that conventional electrostatic discharge protection devices may be connected in series with or in parallel to the connection between pad 8 and drive transistors $2p$, $2n$, in the conventional manner. The drains of drive transistors $2p$, $2n$ are connected to the input of inverter 3, which drives node N at its output. Node N is communicated to the remainder of the integrated circuit in the conventional manner, so that the signal received at pad 8 is processed thereby.

In conventional "TTU" compatible input circuits, the nominal switching threshold voltage of the inverter of drive transistors 2 is preferably 1.4 volts (midway between the standard VIH/VIL levels of 2.0 volts and 0.8 volts, respectively). As a result, drive transistors $2n$, $2p$ are heavily ratioed relative to one another. For example, drive transistor $2n$ may have a width/length (W/L) ratio of approximately 3 to 5 times that of drive transistor $2p$, to provide a drive strength of 6 to 10 times that of drive transistor $2p$ (considering the mobility difference between p-channel and n-channel transistors).

Hysteresis for the low-to-high transition at pad 8 is provided by p-channel transistor $4p$, having its source-drain path connected between the input of inverter 3 and $V_{cc}$, and having its gate connected to node N at the output of inverter 3. Conversely, hysteresis for the high-to-low transition at pad 8 is provided by n-channel transistor $4n$, which has its source-drain path connected between the input of inverter 3 and ground, and which has its gate also connected to node N at the output of inverter 3.

In operation, one of hysteresis transistors 4 will be turned on by inverter 3 according to the prior logic state at pad 8, and will oppose the switching of the input of inverter 3 by the one of drive transistors 2 that is turned on by the new logic level at pad 8. For example, if the previous logic state at pad 8 is a "0", drive transistor $2p$ is on and pulls the input of inverter 3 high. This causes a low level at node N, turning on hysteresis transistor $4p$. In this example, if pad 8 then is driven low, drive transistor $2n$ turns on, and begins to pull the input of inverter 3 low. Since hysteresis transistor $4p$ remains on until inverter 3 switches, the current sourced by hysteresis transistor $4p$ will oppose the action of drive transistor $2n$ in pulling the input of inverter 3 low.

Accordingly, as is well known, the hysteresis of input buffer 1 is determined by the difference in the drive characteristics of drive transistors $2p$, $2n$ relative to their respective opposing hysteresis transistors $4n$, $4p$. If the drive of an hysteresis transistor 4 approaches the drive of its respective opposing drive transistor 2, the magnitude of hysteresis will be quite large; conversely, the hysteresis magnitude will become weaker as the relative drive capability of hysteresis transistor 4 relative to its opposing drive transistor 2 becomes weaker. Proper selection of the hysteresis characteristics of the buffer generally requires that the drive of hysteresis transistors 4 must be much weaker than that of drive transistors 2. As such, in conventional buffers such as buffer 1, hysteresis transistors 4 are conventional fabricated to have much lower W/L ratios than those of drive transistors 2. For example, where the W/L ratio of drive transistor $2n$ is 20, a typical W/L ratio for hysteresis transistor $4p$ is 4.0; conversely, where drive transistor $2p$ has a W/L ratio of 4.6, a typical value of W/L for hysteresis transistor $4n$ may be 0.4.

Especially in modern high speed integrated circuits using sub-micron minimum feature sizes, there are limits to achieving small W/L ratios for hysteresis transistors 4. Firstly, limits exist beyond which the channel width W for hysteresis transistors 4 may be reduced. This is due to small width effects that begin as channel widths are reduced to on the order of three microns. Since the channel width W of drive transistors 2 will generally be quite large to effect rapid switching (e.g., on the order of four to five microns), extremely short channel widths W for hysteresis within the region at which small width effects are present, will result in tracking problems between hysteresis transistors 4 and their opposing drive transistors 2. As such, reduction of the W/L ratio for hysteresis transistors 4 can only in small part be accomplished by reduction of the channel width W, and as such the channel length L of hysteresis transistors 4 must be increased to meet the desired transfer characteristic. For example, for a safe channel width of 4.0 microns in a 0.7 micron minimum feature size process, the channel length L of hysteresis transistors 4 may have to be increased to ten to fifteen times that of drive transistors 2 (i.e., channel length on the order of six to ten microns).

Increase in the channel length L of hysteresis transistors 4 also has limitations, however. Firstly, as the channel length L of hysteresis transistors 4 increases, the gate-to-source capacitive load on inverter 3 at node N greatly increases, slowing the switching characteristics of buffer 1. Additional delays of on the order of 0.2 to 0.5 nsec due to such sizing of hysteresis transistors 4 have been observed; such additional delays are quite significant for circuits such as high-speed static RAMs. In addition, as the channel length L of hysteresis transistors 4 is made significantly larger than that of drive transistors 2, short channel effects are much reduced for hysteresis transistors 4. As a result, normal process variations, such as critical dimension (CD) variations, will non-uniformly affect drive transistors 2 and their opposing hysteresis transistors 4, creating physical mismatch conditions for some locations in the process window. As noted above, the relative drive characteristics between drive transistors 2 and their opposing hysteresis transistors 4 is critical in determining the operation of buffer 1, making such physical mismatch conditions as a function of process directly affect circuit performance. As such, the use of large channel length hysteresis transistors 4 provides poor process tolerance for important circuit parameters such as input buffer switching.

It is therefore an object of the present invention to provide an input buffer circuit with hysteresis characteristics with reduced delay characteristics.

It is a further object of the present invention to provide such an input buffer circuit with improved process tolerance.

Other objects and advantages of the present invention will be apparent to those of ordinary skill in the art having reference to the following specification together with its drawings.

SUMMARY OF THE INVENTION

The present invention may be implemented into an input buffer circuit having a plurality of hysteresis transistors opposing a drive transistor in the first stage. Each of the plurality of hysteresis transistors has substantially the same channel length (i.e., gate width) as its opposing drive transistor, and has a channel width typical for transistors in the circuit. The gates of each of the plurality of hysteresis transistors may each be biased by an inverter having its input receiving the first stage output; alternatively, some of the plurality of hysteresis transistors may have their gates biased into an on state, with the remaining transistor(s) controlled by the inverter.

DETAILED DESCRIPTION OF THE PREFERRED EMBODIMENTS

Figure 1:
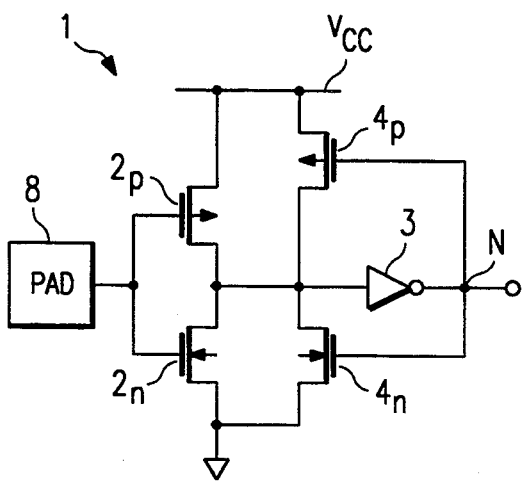
FIG. 1 is an electrical drawing, in schematic form, of a conventional input buffer.
Figure 2:
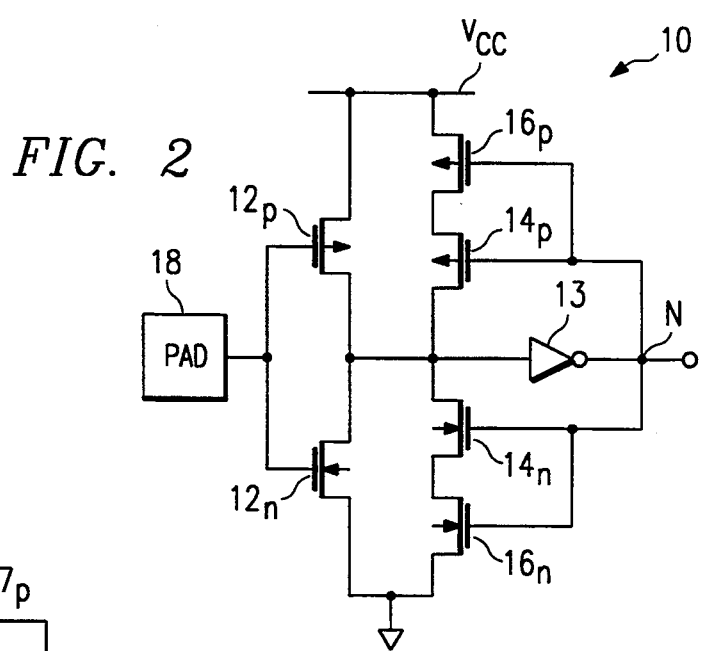
FIGS. 2 through 5 are electrical drawings, in schematic form, of input buffer circuits according to embodiments of the present invention.

Referring now to FIG. 2, input buffer 10 according to a first embodiment of the present invention will now be described. Input buffer 10 includes a CMOS inverter first stage of p-channel MOS drive transistor 12$p$ and n-channel MOS drive transistor 12$n$, having their source-drain paths connected in series between the $V_{cc}$ power supply and ground, and having their gates coupled to pad 18. As in the case of pad 8 of FIG. 1, pad 18 is the bond pad which receives the signal from external to the integrated circuit in which buffer 10 is implemented; conventional electrostatic discharge protection devices may be connected in series with or in parallel to the connection between pad 18 and drive transistors 12$p$, 12$n$, in the conventional manner. The common drain node of drive transistors 12$p$ and 12$n$ is connected to the input of inverter 13, which drives node N at its output; node N is received by other circuitry in the integrated circuit within which buffer 10 is implemented.

According to this embodiment of the invention, a plurality of hysteresis transistors oppose each drive transistor. As shown in FIG. 2, p-channel hysteresis transistors 14$p$, 16$p$ have their source-drain paths connected in series between $V_{cc}$ and the input of inverter 13, and have their gates driven by the output of inverter 13 at node N; conversely, n-channel hysteresis transistors 14$n$, 16$n$ have their source-drain paths connected in series between the input of inverter 13 and ground, and also have their gates driven by the output of inverter 13 at node N.

As may be determined by conventional circuit analysis, the current provided through the series connection of MOS transistors is reduced from that provided by a single transistor. See e.g., Sedra, et al., *Microelectronic Circuits* (Holt, Rinehart & Winston, 1982), pp. 734–35, relative to a CMOS NOR gate implementation. This reduction in current is due to the reduced drain-source voltage across each transistor in the series chain of transistors. According to the present invention, this reduction in current is used to advantage in setting the desired hysteresis condition with transistors of suitable physical size.

Hysteresis transistors 14, 16 in buffer 10 according to this embodiment of the invention are implemented with substantially the same channel length L as that of drive transistors 12, and with channel width W of at least a selected amount as to avoid small width effects. For example, where the nominal channel length of transistors 12 is on the order of 0.7 microns (transistor channel length corresponding to the patterned gate width, depending upon the process), the nominal channel length of hysteresis transistors 14, 16 will be the same, at 0.7 microns. The channel width W will depend upon the particular process conditions used to implement buffer 10, as the onset of significant small width effects will vary from process to process; it is contemplated, however, that for modern sub-micron processing, a safe channel width W will be on the order of four microns. Such a channel width W will allow the performance of hysteresis transistors 14, 16 to track that of drive transistors 12, as drive transistors 12 will generally have a sufficiently large width as to also not be subject to small width effects.

Because of the series connection of hysteresis transistors 14, 16 in each hysteresis leg of buffer 10, the drive current therethrough will be greatly reduced, even where hysteresis transistors 14, 16 have W/L ratios of on the order of 5.0. This series connection allows hysteresis transistors 14, 16 to be fabricated with the same channel length (i.e., gate width) as drive transistors 12, which will generally be at the design rule minimum for fast switching speeds. This small channel length for hysteresis transistors 14, 16 will result in relatively small capacitive loading on the output of inverter 13 at node N, even considering that four such transistors 14, 16 are connected thereto, as the gate capacitance resulting from four transistors of small channel lengths will be much smaller than that which would result from a pair of hysteresis transistors (such as transistor 4 in FIG. 1) of sufficient channel length to set the proper hysteresis characteristics. Accordingly, good hysteresis characteristics are provided by buffer 10 with minimal additional propagation delay therethrough due to increased capacitive loading.

In addition, the ability to implement hysteresis transistors 14, 16 with approximately the same channel length as drive transistors 12, and with channel widths that are sufficiently large to avoid small width effects, enables the transistor characteristics of hysteresis transistors 14, 16 to follow those of drive transistors 12 over variations in process, $V_{cc}$ power supply bias, temperature and the like. As a result, the hysteresis operation of buffer 10 not only has reduced propagation delays, but provides noise immunity to the circuit in a robust and stable manner.

It should be noted that, depending upon the particular process used, the minimum channel lengths and the critical channel widths at which the onset of small width effects occurs, may vary between p-channel and n-channel transistors. It is contemplated that such differences would carry over into the hysteresis transistors as well, such that the same differences would also appear in the channel widths and lengths of p-channel and n-channel hysteresis transistors as in drive transistors.

Figure 3:
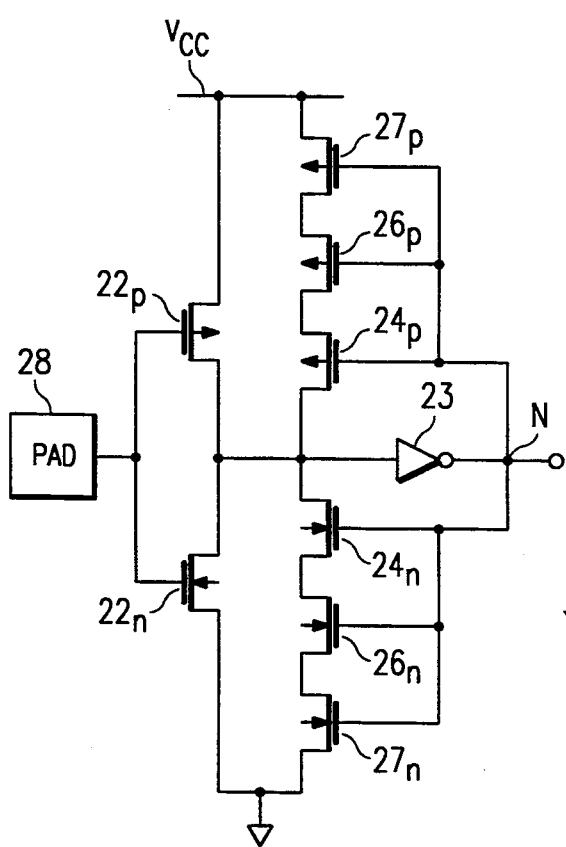

Various alternative embodiments of the present invention are also contemplated. The magnitude of hysteresis in the buffer circuit, as evident from the foregoing, is defined by the current drive through the hysteresis legs. Accordingly, for a given channel length and channel width, the hysteresis magnitude will depend upon the number of series hysteresis transistors in the hysteresis legs. Referring to FIG. 3, buffer 20 according to such an alternative embodiment is illustrated.

Buffer 20 in FIG. 3 is constructed similarly as buffer 10 in FIG. 2, with a first stage of drive transistors 22n, 22p configured as a CMOS inverter, having their gates connected to pad 28 and their common drain node connected to the input of inverter 23. In the embodiment of FIG. 3, the output of inverter 23 is connected to the gates of three hysteresis transistors 24, 26, 27 in each leg (p-channel hysteresis transistors 24p, 26p, 27p in series between $V_{cc}$ and the input of inverter 23, and n-channel hysteresis transistors 24n, 26n, 27n in series between the input of inverter 23 and ground).

As in the case of buffer 10 of FIG. 2, hysteresis transistors 24, 26, 27 each have channel lengths that are approximately the same as that of drive transistors 22, and each have channel widths that are sufficiently large as to avoid small width effects. Because of the presence of three hysteresis transistors 24, 26, 27 in each hysteresis leg, however, the opposing current would be further reduced in the event of a switching logic state at pad 18. The hysteresis magnitude of buffer 20 of FIG. 3 would be less than that in buffer 10 of FIG. 2. However, this reduced hysteresis would be obtained with minimal additional delay (since hysteresis transistors 27 still have minimum channel length) and in a similarly robust and stable manner as that discussed above relative to buffer 10.

It should now be apparent to those of ordinary skill in the art that the number of hysteresis transistors in each leg may vary, with the number of transistors depending upon the magnitude of noise immunity desired. Furthermore, it may be useful, for some applications, to have different hysteresis magnitudes for the two transition polarities, such that there may be more or less p-channel hysteresis transistors than n-channel hysteresis transistors. Indeed, for some circuit applications no hysteresis may be desired for one transition, in which case only p-channel or n-channel hysteresis transistors would be utilized.

Further in the alternative, while inverters are shown in the above-described buffers as driving the gates of the hysteresis transistors, it will of course be recognized that a non-inverting driver may alternatively be used in the hysteresis feedback loop, so long as the conductivity type of the hysteresis transistors is selected accordingly. It is preferable to use hysteresis transistors according to a CMOS configuration (i.e., p-channel pull-up and n-channel pull-down), however, as this allows for full rail-to-rail transitions to be driven.

Figure 4:
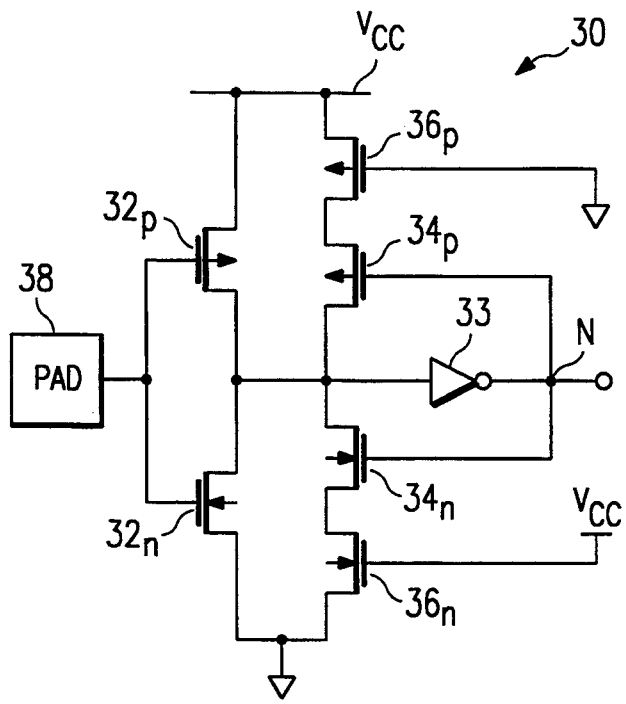

Further in the alternative, some of the hysteresis transistors in a leg may be biased to an on state at all times, rather than being driven by the buffer itself. Referring to FIG. 4, buffer 30 according to such an embodiment is illustrated.

As in the embodiments described hereinabove, buffer 30 has a first CMOS inverter stage of drive transistors 32n, 32p with their gates connected to pad 38 and their source-drain paths connected in series between $V_{cc}$ and ground. Inverter 33 has its input connected to the common drain node of transistors 32, and its output drives node N.

The hysteresis legs of buffer 30 of FIG. 4 include two transistors 34, 36, each constructed with substantially the same channel length as drive transistors 32 and with sufficient channel width to avoid small width effects, as discussed above. According to this embodiment of the invention, however, only the gates of hysteresis transistors 34p, 34n are driven by the output of inverter 33 at node N, while the gates of series hysteresis transistors 36p, 36n are biased into an "on" state by ground and $V_{cc}$, respectively. The current provided by each hysteresis leg when its transistor 34 is turned on by inverter 33 will thus be limited by the on-biased transistor 36 in that leg. Elementary circuit analysis can be used to determine the actual current, and thus the hysteresis characteristic, provided by this configuration. The benefits of minimal additional propagation delay, with good tracking relative to the drive transistors, process tolerance, and performance stability, are also obtained by the use of buffer 30 of FIG. 4. However, since the number of transistor gates coupled to the output of inverter 33 is reduced to one transistor per hysteresis leg, the capacitive loading on the output of inverter 33 is further reduced relative to the embodiments described hereinabove where all of the transistor gates are connected to the inverter output. As such, the propagation delay through buffer 30 is even further improved.

Figure 5:
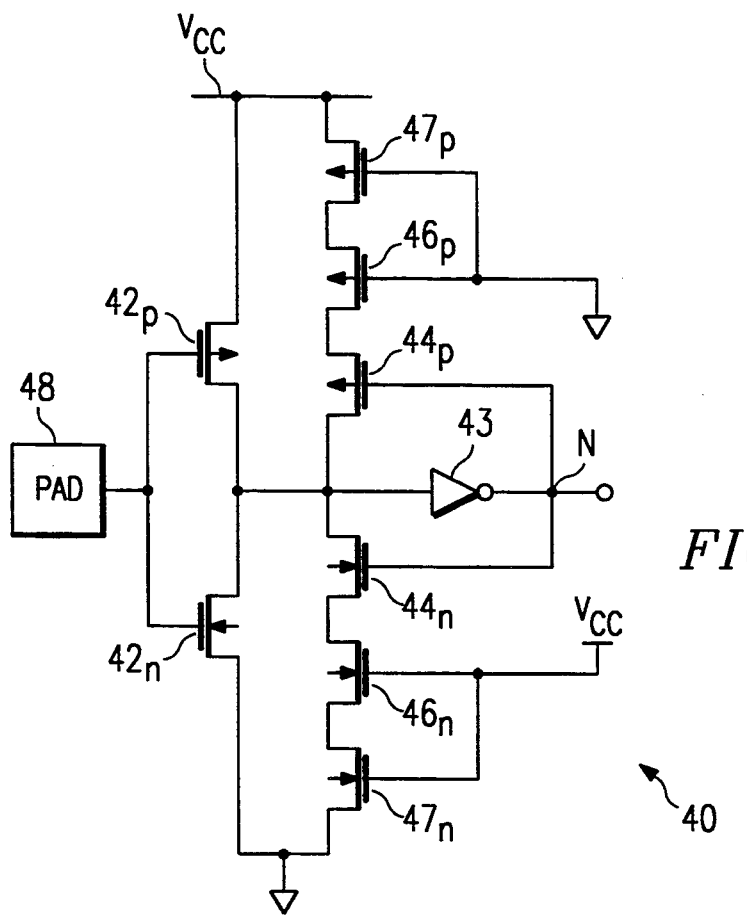

Yet another alternative is illustrated in FIG. 5, relative to buffer 40, which includes a first CMOS inverter stage of drive transistors 42n, 42p with their gates connected to pad 48 and their source-drain paths connected in series between $V_{cc}$ and ground. Inverter 43 has its input connected to the common drain node of transistors 42, and its output drives node N.

In this embodiment of the invention, each hysteresis leg includes three transistors 44, 46, 47, each constructed with substantially the same channel length as drive transistors 42 and with sufficient channel width to avoid small width effects, as discussed above. Hysteresis transistors 46p and 47p are biased to an "on" state from ground, with hysteresis transistor 44p controlled by the output of inverter 43; conversely, hysteresis transistors 46n and 47n are biased to an "on" state from $V_{cc}$, with hysteresis transistor 44n controlled by the output of inverter 43. This configuration will provide yet another different value of current in its hysteresis legs, and thus different noise immunity levels, as determinable by rudimentary circuit analysis. As in the earlier cases, buffer 40 provides good characteristic tracking between hysteresis transistors 44, 46, 47, on the one hand, and drive transistors 42, on the other hand, with minimal additional propagation delay (especially considering that only one transistor gate per hysteresis leg is driven by inverter 43), and with robustness relative to process variations.

It should also be apparent that variations in the number of hysteresis transistors and their biasing may also be implemented according to the present invention, depending upon the level of hysteresis current desired. For example, one configuration may have the gates of all of the n-channel hysteresis transistors connected to the inverter output, with only one of the p-channel hysteresis transistor gates driven by the inverter (the others biased to an on-state as shown in FIG. 5). It is contemplated that these and other variations are within the scope of the present invention.

Furthermore, while the present invention has been described relative to input buffer circuits, because of the noise immunity necessary relative to external conductors, the present invention may also be used internally within the integrated circuit to provide hysteresis characteristics for buffers therewithin, and with the same benefits as noted above.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A buffer circuit, comprising:
    a first drive transistor of the field-effect type, having a gate for receiving an input signal, having a source biased by a first reference voltage, and having a drain;
    a driver circuit having an input coupled to the drain of said first drive transistor, and having an output;
    a first plurality of hysteresis transistors of the field-effect type, said first plurality of hysteresis transistors having their source-drain paths connected in series between the input of the driver circuit and a second reference voltage, a first one of said first plurality of hysteresis transistors having its gate coupled to the output of said driver circuit, and a second one of said first plurality of hysteresis transistors has its gate biased to a voltage sufficient to place it in a conductive state, so that the source-drain paths of said first plurality of hysteresis transistors are conductive responsive to the output of said driver circuit being at a first logic state;
    wherein the logic state corresponding to said first reference voltage, when presented to the input of said driver circuit, causes said driver circuit to place its output at a second logic state;
    and wherein the channel length of each of said first plurality of hysteresis transistors is approximately the same as that of said first drive transistor.

2. The buffer circuit of claim 1, wherein said first plurality of hysteresis transistors consists of two hysteresis transistors.

3. The buffer circuit of claim 1, wherein said driver circuit comprises an inverter;
    and wherein each of said first plurality of hysteresis transistors is of the opposite conductivity-type from that of said first drive transistor.

4. The buffer circuit of claim 1, wherein the channel width of each of said first plurality of hysteresis transistors is sufficiently large to avoid significant small width effects.

5. The buffer circuit of claim 1, further comprising:
    a second drive transistor of the field-effect type, having a gate for receiving said input signal, having a source biased by a second reference voltage, and having a drain coupled to the drain of said first drive transistors;
    a second plurality of hysteresis transistors of the field-effect type, said second plurality of hysteresis transistors having their source-drain paths connected in series between the input of the driver circuit and said first reference voltage, at least one of said second plurality of hysteresis transistors having its gate coupled to the output of said driver circuit so that the source-drain paths of said second plurality of hysteresis transistors are conductive responsive to the output of said driver circuit being at said second logic state;
    wherein the logic state corresponding to said second reference voltage, when presented to the input of said driver circuit, causes said driver circuit to place its output at said first logic state;
    and wherein the channel length of each of said second plurality of hysteresis transistors is approximately the same as that of said second drive transistor.

6. The buffer circuit of claim 5, wherein said second plurality of hysteresis transistors consists of two hysteresis transistors.

7. The buffer circuit of claim 5, wherein the channel width of each of said first and second pluralities of hysteresis transistors is sufficiently large to avoid significant small width effects.

8. The buffer circuit of claim 5, wherein a first one of said second plurality of hysteresis transistors has its gate coupled to the output of the driver circuit;
    and wherein a second one of said second plurality of hysteresis transistors has its gate biased to a voltage sufficient to place it in a conductive state.

9. The buffer circuit of claim 1, wherein said buffer circuit is implemented in an integrated circuit;
    and wherein said input signal is received from external to said integrated circuit.

10. A complementary MOS buffer circuit, comprising:
    an n-channel drive transistor, having a source biased to a reference voltage, and having a drain and gate;
    a p-channel drive transistor, having a source biased to a power supply voltage, having a drain coupled to the drain of said n-channel drive transistor, and having a gate coupled to the gate of said n-channel drive transistor;
    an inverting circuit, having an input coupled to the drains of said n-channel and p-channel drive transistors, and having an output;

first and second p-channel hysteresis transistors having their source/drain paths connected in series between the input of said inverting circuit and said power supply voltage, said first p-channel hysteresis transistor having its gate coupled to the output of said inverting circuit and said second p-channel hysteresis transistor having its gate coupled to the output of said inverting circuit, said first and second p-channel transistors each having a channel length substantially the same as the channel length of said p-channel drive transistor; and first and second n-channel hysteresis transistors having their source/drain paths connected in series between the input of said inverting circuit and said reference voltage, said first n-channel hysteresis transistor having its gate coupled to the output of said inverting circuit, said first and second n-channel transistors each having a channel length substantially the same as the channel length of said n-channel drive transistor.

11. A complementary MOS buffer circuit, comprising:

an n-channel drive transistor, having a source biased to a reference voltage, and having a drain and gate;

a p-channel drive transistor, having a source biased to a power supply voltage, having a drain coupled to the drain of said n-channel drive transistor, and having a gate coupled to the gate of said n-channel drive transistor;

an inverting circuit, having an input coupled to the drains of said n-channel and p-channel drive transistors, and having an output;

first and second p-channel hysteresis transistors having their source/drain paths connected in series between the input of said inverting circuit and said power supply voltage, said first p-channel hysteresis transistor having its gate coupled to the output of said inverting circuit, said first and second p-channel transistors each having a channel length substantially the same as the channel length of said p-channel drive transistor; and first and second n-channel hysteresis transistors having their source/drain paths connected in series between the input of said inverting circuit and said reference voltage, said first n-channel hysteresis transistor having its gate coupled to the output of said inverting circuit and said second n-channel hysteresis transistor having its gate coupled to the output of said inverting circuit, said first and second n-channel transistors each having a channel length substantially the same as the channel length of said n-channel drive transistor.

12. A complementary MOS buffer circuit, comprising:

an n-channel drive transistor, having a source biased to a reference voltage, and having a drain and gate;

a p-channel drive transistor, having a source biased to a power supply voltage, having a drain coupled to the drain of said n-channel drive transistor, and having a gate coupled to the gate of said n-channel drive transistor;

an inverting circuit, having an input coupled to the drains of said n-channel and p-channel drive transistors, and having an output;

first and second p-channel hysteresis transistors having their source/drain paths connected in series between the input of said inverting circuit and said power supply voltage, said first p-channel hysteresis transistor having its gate coupled to the output of said inverting circuit, said first and second p-channel transistors each having a channel length substantially the same as the channel length of said p-channel drive transistor; and first and second n-channel hysteresis transistors having their source/drain paths connected in series between the input of said inverting circuit and said reference voltage, said first n-channel hysteresis transistor having its gate coupled to the output of said inverting circuit and said second n-channel hysteresis transistor having its gate biased to said power supply voltage, said first and second n-channel transistors each having a channel length substantially the same as the channel length of said n-channel drive transistor.

13. A complementary MOS buffer circuit, comprising:

an n-channel drive transistor, having a source biased to a reference voltage, and having a drain and gate;

a p-channel drive transistor, having a source biased to a power supply voltage, having a drain coupled to the drain of said n-channel drive transistor, and having a gate coupled to the gate of said n-channel drive transistor;

an inverting circuit, having an input coupled to the drains of said n-channel and p-channel drive transistors, and having an output;

first and second p-channel hysteresis transistors having their source/drain paths connected in series between the input of said inverting circuit and said power supply voltage, said first p-channel hysteresis transistor having its gate coupled to the output of said inverting circuit and said second p-channel hysteresis transistor having its gate biased to said reference voltage, said first and second p-channel transistors each having a channel length substantially the same as the channel length of said p-channel drive transistor; and first and second n-channel hysteresis transistors having their source/drain paths connected in series between the input of said inverting circuit and said reference voltage, said first n-channel hysteresis transistor having its gate coupled to the output of said inverting circuit, said first and second n-channel transistors each having a channel length substantially the same as the channel length of said n-channel drive transistor.

14. A complementary MOS buffer circuit, comprising:

an n-channel drive transistor, having a source biased to a reference voltage, and having a drain and gate;

a p-channel drive transistor, having a source biased to a power supply voltage, having a drain coupled to the drain of said n-channel drive transistor, and having a gate coupled to the gate of said n-channel drive transistor;

an inverting circuit, having an input coupled to the drains of said n-channel and p-channel drive transistors, and having an output;

first and second p-channel hysteresis transistors having their source/drain paths connected in series between the input of said inverting circuit and said power supply voltage, said first p-channel hysteresis transistor having its gate coupled to the output of said inverting circuit, said first and second p-channel transistors each having a channel length substantially the same as the channel length of said p-channel drive transistor;

a third p-channel hysteresis transistor, having its source-drain path connected in series with the source-drain paths of said first and second p-channel hysteresis transistors between the input of said inverting circuit and said power supply voltage, and having its gate coupled to the output of said inverting circuit; and first and second n-channel hysteresis transistors having their source/drain paths connected in series between the input of said inverting circuit and said reference voltage, said first n-channel hysteresis transistor having its gate coupled to the output of said inverting circuit, said first and second n-channel transistors each having a channel length substantially the same as the channel length of said n-channel drive transistor.

15. A complementary MOS buffer circuit, comprising:

an n-channel drive transistor, having a source biased to a reference voltage, and having a drain and gate;

a p-channel drive transistor, having a source biased to a power supply voltage, having a drain coupled to the drain of said n-channel drive transistor, and having agate coupled to the gate of said n-channel drive transistor;

an inverting circuit, having an input coupled to the drains of said n-channel and p-channel drive transistors, and having an output;

first and second p-channel hysteresis transistors having their source/drain paths connected in series between the input of said inverting circuit and said power supply voltage, said first p-channel hysteresis transistor having its gate coupled to the output of said inverting circuit, said first and second p-channel transistors each having a channel length substantially the same as the channel length of said p-channel drive transistor;

first and second n-channel hysteresis transistors having their source/drain paths connected in series between the input of said inverting circuit and said reference voltage, said first n-channel hysteresis transistor having its gate coupled to the output of said inverting circuit, said first and second n-channel transistors each having a channel length substantially the same as the channel length of said n-channel drive transistor; and a third n-channel hysteresis transistor, having its source-drain path connected in series with the source-drain paths of said first and second n-channel hysteresis transistors between the input of said inverting circuit and said reference voltage, and having its gate coupled to the output of said inverting circuit.

16. A complementary MOS buffer circuit, comprising:

an n-channel drive transistor, having a source biased to a reference voltage, and having a drain and gate;

a p-channel drive transistor, having a source biased to a power supply voltage, having a drain coupled to the drain of said n-channel drive transistor, and having a gate coupled to the gate of said n-channel drive transistor;

an inverting circuit, having an input coupled to the drains of said n-channel and p-channel drive transistors, and having an output;

first and second p-channel hysteresis transistors having their source/drain paths connected in series between the input of said inverting circuit and said power supply voltage, said first p-channel hysteresis transistor having its gate coupled to the output of said inverting circuit, said first and second p-channel transistors each having a channel length substantially the same as the channel length of said p-channel drive transistor;

a third p-channel hysteresis transistor, having its source-drain path connected in series with the source-drain paths of said first and second p-channel hysteresis transistors between the input of said inverting circuit and said power supply voltage, and having its gate biased by said reference voltage; and first and second n-channel hysteresis transistors having their source/drain paths connected in series between the input of said inverting circuit and said reference voltage, said first n-channel hysteresis transistor having its gate coupled to the output of said inverting circuit, said first and second n-channel transistors each having a channel length substantially the same as the channel length of said n-channel drive transistor.

17. A complementary MOS buffer circuit, comprising:

an n-channel drive transistor, having a source biased to a reference voltage, and having a drain and gate;

a p-channel drive transistor, having a source biased to a power supply voltage, having a drain coupled to the drain of said n-channel drive transistor, and having a gate coupled to the gate of said n-channel drive transistor;

an inverting circuit, having an input coupled to the drains of said n-channel and p-channel drive transistors, and having an output;

first and second p-channel hysteresis transistors having their source/drain paths connected in series between the input of said inverting circuit and said power supply voltage, said first p-channel hysteresis transistor having its gate coupled to the output of said inverting circuit, said first and second p-channel transistors each having a channel length substantially the same as the channel length of said p-channel drive transistor;

first and second n-channel hysteresis transistors having their source/drain paths connected in series between the input of said inverting circuit and said reference voltage, said first n-channel hysteresis transistor having its gate coupled to the output of said inverting circuit, said first and second n-channel transistors each having a channel length substantially the same as the channel length of said n-channel drive transistor; and a third n-channel hysteresis transistor, having its source-drain path connected in series with the source-drain paths of said first and second n-channel hysteresis transistors between the input of said inverting circuit and said reference voltage, and having its gate biased by said power supply voltage.

18. The buffer circuit of claim 10, wherein the channel width of each of said first and second n-channel hysteresis transistors and each of said first and second p-channel transistors is sufficient to avoid significant small width effects.

19. The buffer circuit of claim 11, wherein the channel width of each of said first and second n-channel hysteresis transistors and each of said first and second p-channel transistors is sufficient to avoid significant small width effects.

20. The buffer circuit of claim 12, wherein the channel width of each of said first and second n-channel hysteresis transistors and each of said first and second p-channel transistors is sufficient to avoid significant small width effects.

21. The buffer circuit of claim 13, wherein the channel width of each of said first and second n-channel hysteresis transistors and each of said first and second p-channel transistors is sufficient to avoid significant small width effects.

* * * * *